(12) United States Patent
Imamura et al.

(10) Patent No.: US 7,439,611 B2
(45) Date of Patent: Oct. 21, 2008

(54) CIRCUIT BOARD WITH AUXILIARY WIRING CONFIGURATION TO SUPPRESS BREAKAGE DURING BONDING PROCESS

(75) Inventors: Hiroyuki Imamura, Osaka (JP); Nobuyuki Koutani, Osaka (JP); Yoshifumi Nakamura, Osaka (JP); Kenshi Tokushima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 158 days.

(21) Appl. No.: 11/534,288

(22) Filed: Sep. 22, 2006

(65) Prior Publication Data

US 2007/0075439 A1    Apr. 5, 2007

(30) Foreign Application Priority Data

Sep. 30, 2005    (JP)    ............... 2005-287854

(51) Int. Cl.
*H01L 23/495*    (2006.01)
(52) U.S. Cl. ................. 257/669; 257/674; 257/E23.039
(58) Field of Classification Search ................. 257/669, 257/674
See application file for complete search history.

(56) References Cited

U.S. PATENT DOCUMENTS

| | | | | |
|---|---|---|---|---|
| 5,138,438 A | * | 8/1992 | Masayuki et al. | ............ 257/686 |
| 6,064,112 A | * | 5/2000 | Iwaya et al. | ................. 257/673 |
| 6,097,081 A | * | 8/2000 | Masuda et al. | ............... 257/666 |
| 6,509,639 B1 | * | 1/2003 | Lin | ............................. 257/686 |
| 2004/0212969 A1 | | 10/2004 | Imamura et al. | |
| 2007/0057369 A1 | * | 3/2007 | Imamura et al. | ............ 257/737 |

FOREIGN PATENT DOCUMENTS

JP    2004-327936    11/2004

* cited by examiner

*Primary Examiner*—Marcos D. Pizarro
*Assistant Examiner*—Eva Montalvo
(74) *Attorney, Agent, or Firm*—Hamre, Schumann, Mueller & Larson, P.C.

(57) ABSTRACT

A circuit board including a flexible insulating substrate, a plurality of conductive wirings placed in line on the flexible insulating substrate, and bumps provided at end portions of the respective conductive wirings positioned in a region for mounting a semiconductor chip is provided. The circuit board further includes an auxiliary conductive wiring positioned at an outermost corner of the region for mounting the semiconductor chip, being adjacent to and an outside the outermost conductive wiring, and an auxiliary bump formed on the auxiliary conductive wiring in line with the bumps on the conductive wirings. One end portion of the auxiliary conductive wiring is terminated at a position in the outside vicinity of the auxiliary bump in an outward direction of the region for mounting the semiconductor chip, and the auxiliary conductive wiring is bent at the other end portion positioned inside the auxiliary bump in an inward direction of the region for mounting the semiconductor chip, and connected to an end of the adjacent outermost conductive wiring. A break in the outermost conductive wiring, which is caused by concentrated stress at the time of joining the bumps of the circuit board and electrode pads of the semiconductor chip, can be suppressed.

3 Claims, 4 Drawing Sheets

CIRCUIT BOARD WITH AUXILIARY WIRING CONFIGURATION TO SUPPRESS BREAKAGE DURING BONDING PROCESS

BACKGROUND OF THE INVENTION

1. Field of the Invention

The present invention relates to a circuit board such as a tape carrier substrate used in a chip-on-film device (COF), and a semiconductor device formed by joining the circuit board and a semiconductor chip.

2. Description of Related Art

As one type of package module using a film substrate, the one employing a COF structure has been known. FIG. 5 is a cross-sectional view showing a part of one example of a COF described in JP 2004-327936 A. The COF includes a semiconductor chip 4 mounted on a tape carrier substrate of a flexible and insulating film substrate 1 and is protected by an encapsulation resin 5. Such a COF mainly is used as a driver for operating a flat panel display.

The tape carrier substrate includes as main components an insulating film substrate 1, conductive wirings 2 formed on a surface of the film substrate 1 and upper surfaces of bumps 3 on the conductive wirings 2. As required, a metal coating 6 is plated on some parts of the conductive wirings 2 and on the bumps 3, while a layer of solder resist 7 as an insulating resin is formed on the other parts of the conductive wirings 2. In general, polyimide is used as a material of the film substrate 1 and copper is used as a material of the conductive wirings 2. The bumps 3 are formed in general by forming the conductive wirings 2 on the film substrate 1 and then plating a metal thereon.

The conductive wirings 2 are connected to the electrode pads 8 on the semiconductor chip 4 via the bumps 3. In a typical connecting method, an encapsulation resin is applied on a region for mounting a semiconductor chip on the tape carrier substrate, and subsequently the electrode pads 8 on the semiconductor chip 4 and the bumps on the tape carrier substrate are placed opposing each other, to which ultrasonic waves, heat and pressure are applied.

FIG. 6 is a plan view showing schematically an example where the electrode pads 8 on the semiconductor chip 4 and the bumps 3 on the tape carrier substrate are placed opposing each other. It should be noted that the film substrate 1 is not shown in the drawing when viewed from the film substrate 1 side, for viewability. As shown in FIG. 6, typically the plural conductive wirings 2 on the region for mounting the semiconductor chip 4 are straight and parallel to each other.

As mentioned above, when mounting the semiconductor chip on the tape carrier substrate, the electrode pads 8 on the semiconductor chip 4 and the bumps 3 on the tape carrier substrate are subjected to ultrasonic waves, heat and pressure. At that time, stresses caused by the ultrasonic waves and the pressure will be concentrated particularly on the corner areas of the semiconductor chip 4, and thus the outermost conductive wirings 2 will be broken easily. FIG. 7 shows a break in a conductive wiring 2 at one corner of the semiconductor chip 4. As shown in FIG. 7, such a break 9 in the conductive wiring 2 will occur most in a bump 3 along the periphery side on the semiconductor chip 4.

In order to cope with the problem, for example, the outermost conductive wirings 2 are made thicker than the remaining conductive wirings 2. In such a case, however, since the bumps 3 are formed by plating a metal after formation of the conductive wirings 2, the bumps 3 on the outermost conductive wirings 2 will become taller than the bumps 3 of the other conductive wirings 2. This causes a level difference among the bumps 3 and results in connection failure. Therefore, this measure is not suitable for mounting the semiconductor chip 4.

Moreover, if the conductive wirings 2 become narrow due to the future trend of making the lead pitch narrower, the above-mentioned break 9 will occur more easily, and it can cause problems.

SUMMARY OF THE INVENTION

Therefore, with the foregoing in mind, it is an object of the present invention to provide a circuit board that can suppress a break in an outermost conductive wiring, which is caused by concentrated stress at the time of joining bumps on a circuit board and electrode pads on a semiconductor chip.

The circuit board of the present invention includes, as basic components, a flexible insulating substrate, a plurality of conductive wirings formed in line on the flexible insulating substrate, and bumps provided at the end portions of the respective conductive wirings positioned in a region for mounting a semiconductor chip, on which the semiconductor chip can be mounted by bonding electrode terminals formed on the semiconductor chip to the bumps.

For achieving the above-mentioned object, a circuit board of the present invention according to a first configuration includes further an auxiliary conductive wiring positioned at an outermost corner of the region for mounting the semiconductor chip, being adjacent to and outside the outermost conductive wiring, and an auxiliary bump formed on the auxiliary conductive wirings in line with the bumps on the conductive wirings, wherein one end portion of the auxiliary conductive wiring is terminated at a position in the outside vicinity of the auxiliary bump in an outward direction of the region for mounting the semiconductor chip, and the auxiliary conductive wiring is bent at the other end portion positioned inside the auxiliary bump in an inward direction of the region for mounting the semiconductor chip, and connected to an end of an adjacent outermost conductive wiring.

In a circuit board of the present invention according to a second configuration, one end portion of the outermost conductive wiring positioned at the outermost corner of the region for mounting the semiconductor chip is terminated in the outside vicinity of the bump in an outward direction of the region for mounting the semiconductor chip, and the outermost conductive wiring is bent at a position inside the bump in the region for mounting the semiconductor chip so as to cross a side edge of the region for mounting the semiconductor chip adjacent to a side edge where the bumps are arranged and to extend outwards.

In a circuit board of the present invention according to a third configuration, each outermost conductive wiring positioned at an outermost corner of the region for mounting the semiconductor chip has at least one bent portion at a position between the bump and the periphery of the region for mounting the semiconductor chip.

DETAILED DESCRIPTION OF THE INVENTION

Figure 1:
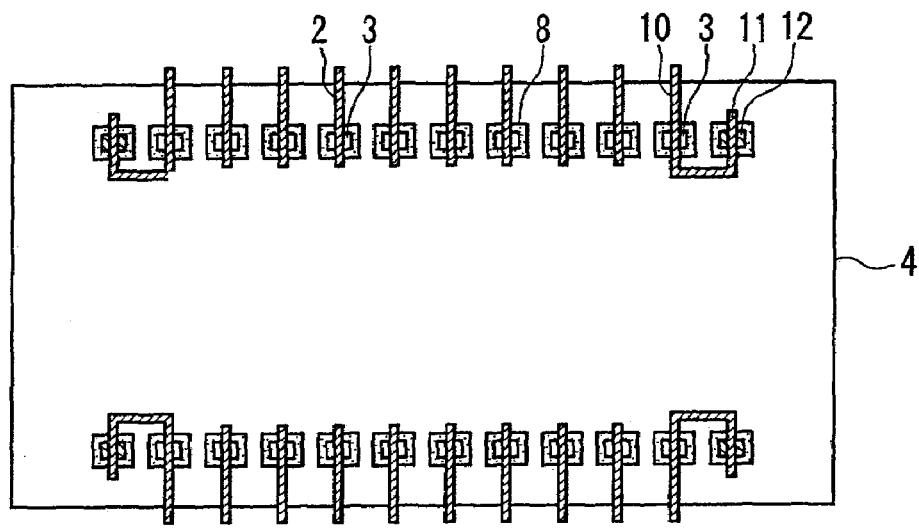
FIG. 1 is a plan view showing a part of a tape carrier substrate in a first embodiment of the present invention.

A circuit board according to a first configuration of the present invention includes an auxiliary conductive wiring positioned at an outermost corner of the region for mounting the semiconductor chip, being adjacent to and outside the outermost conductive wiring, and an auxiliary bump formed on the auxiliary conductive wiring in line with the bumps on the conductive wirings. One end portion of the auxiliary conductive wiring is terminated at a position in the outside vicinity of the auxiliary bump in an outward direction of the region for mounting the semiconductor chip, and the auxiliary conductive wiring is bent at the other end portion positioned inside the auxiliary bump in an inward direction of the region for mounting the semiconductor chip, and connected to an end of an adjacent outermost conductive wiring. Therefore, concentration of stress on the outermost conductive wiring can be relieved due to the arrangement of the auxiliary bump, and a break in the wiring can be suppressed.

In this specification, "auxiliary conductive wiring" means the wiring provided in a form different from the other normal conductive wirings.

It is preferable in the circuit board according to the first configuration that the auxiliary conductive wiring is terminated at a position outside the auxiliary bump, with a length beyond the auxiliary bump being more than 0 μm and less than 300 μm.

It is also preferable that a dummy conductive wiring is provided along an extension from the end of the auxiliary conductive wiring in an outward direction of the region for mounting the semiconductor chip, the dummy conductive wiring being discontinuous from the auxiliary conductive wiring.

In a circuit board according to a second configuration of the present invention, one end portion of the outermost conductive wiring positioned at the outermost corner of the region for mounting the semiconductor chip is terminated in the outside vicinity of the bump in an outward direction of the region for mounting the semiconductor chip, and the outermost conductive wiring is bent at a position inside the bump in the region for mounting the semiconductor chip so as to cross a side edge of the region for mounting the semiconductor chip adjacent to a side edge where the bumps are arranged and to extend outwards. Accordingly, it is avoided to form a wiring at a region of the outermost conductive wiring on which stress will be concentrated, and a wiring for the region is formed into a different pattern, thereby a break in wiring caused by the concentration of stress can be avoided.

In the circuit board according to the second configuration of the present invention, it is preferable that the outermost conductive wiring positioned at the outermost corner of the region for mounting the semiconductor chip is terminated at a position outside the bump, with a length beyond the bump being more than 0 μm and less than 300 μm.

It is also preferable that a dummy conductive wiring is provided along extension from the end of the auxiliary conductive wiring in an outward direction of the region for mounting the semiconductor chip, the dummy conductive wiring being discontinuous from the auxiliary conductive wiring.

In a circuit board according to a third configuration of a circuit board, each outermost conductive wiring positioned at an outermost corner of the region for mounting the semiconductor chip has at least one bent portion at a position between the bump and the periphery of the region for mounting the semiconductor chip. Since such a bent portion is provided at a position on which stress in the outermost conductive wiring will be concentrated, concentration of stress can be relieved to suppress a break in the wiring.

A semiconductor device of the present invention includes a circuit board of any embodiments above and a semiconductor chip mounted on the circuit board, where electrode pads of the semiconductor chip and the respective conductive wirings are connected to each other via the bumps.

Figure 5:
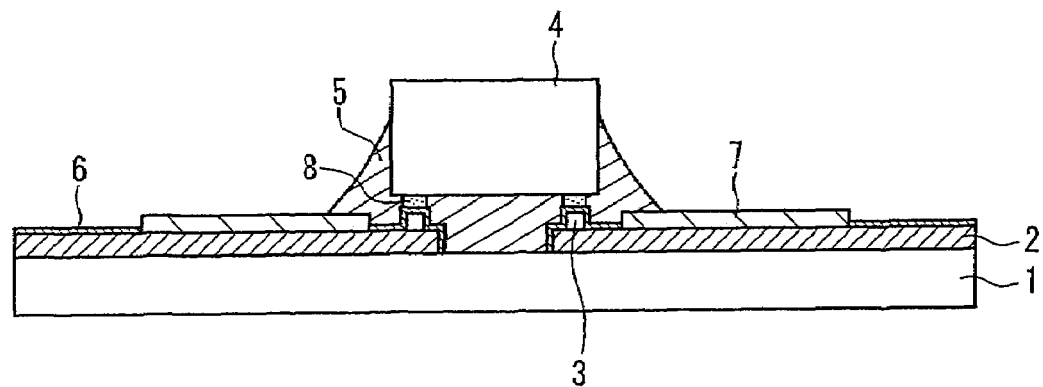
FIG. 5 is a cross-sectional view showing a part of a semiconductor device including a conventional tape carrier substrate.
Figure 6:
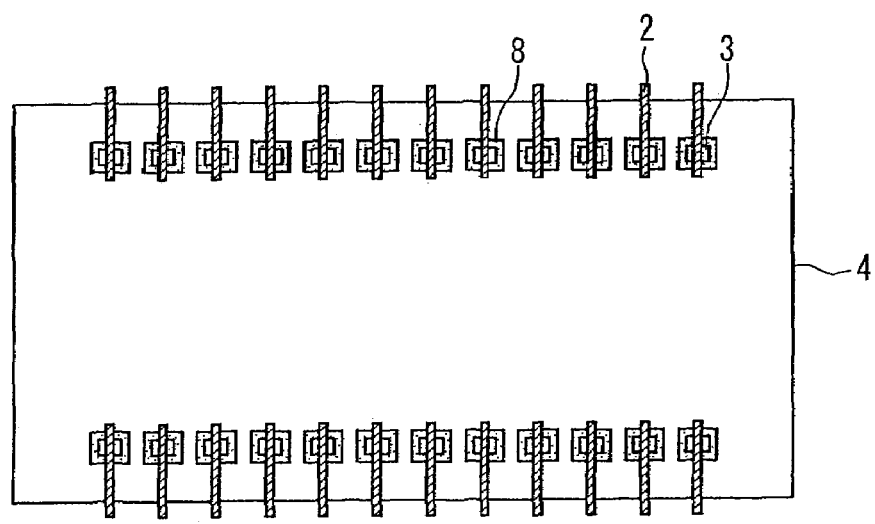
FIG. 6 is a plan view showing a part of a conventional tape carrier substrate.
Figure 7:
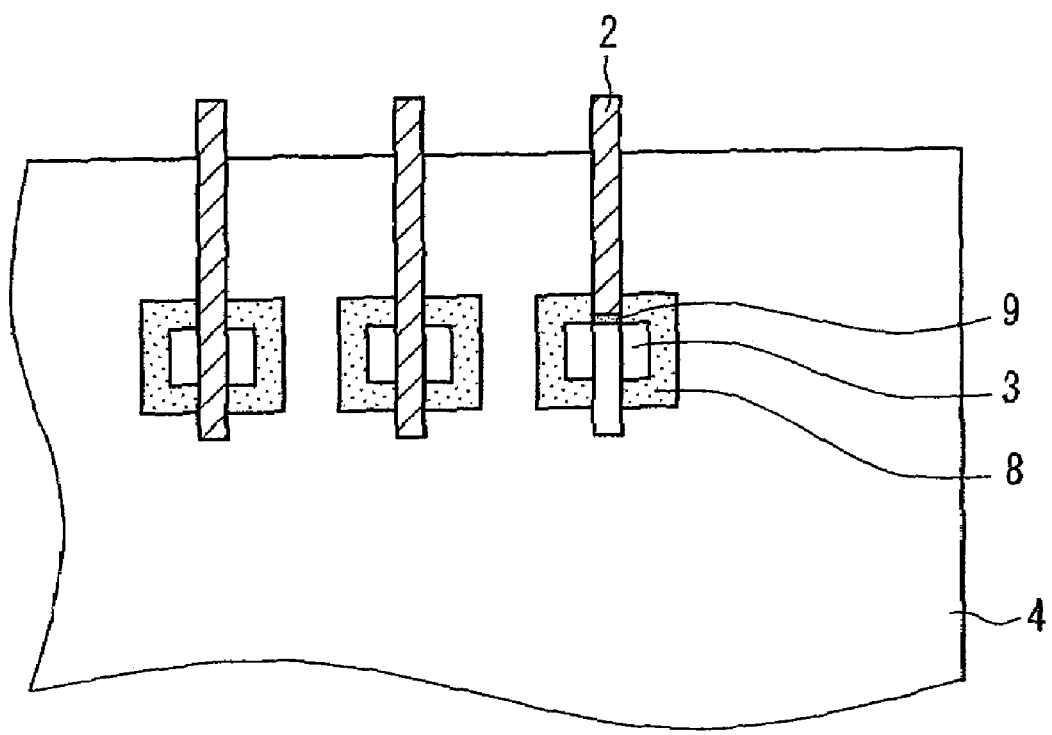
FIG. 7 is a plan view showing a part of a conventional semiconductor device.

Hereinafter, the present invention will be described by way of illustrative embodiments with reference to the drawings. Note that the members identical to those in the conventional example described with reference to FIGS. 5-7 are assigned the same reference signs for avoiding a duplicated explanation.

First Embodiment

The configuration of a tape carrier substrate (circuit board) in a first embodiment will be described with reference to FIG. 1. FIG. 1 is a plan view showing a region for mounting a semiconductor chip of the tape carrier substrate in the first embodiment. For viewability, the structure viewed from the film substrate 1 (see FIG. 5) side is shown while the film substrate 1 is not shown in FIG. 1, so as to indicate schematically the relationship between conductive wirings 2 with bumps 3 and electrode pads 8 on a semiconductor chip 4. These components are indicated similarly in the following embodiments.

As shown in FIG. 1, the bumps 3 are formed respectively on the plural conductive wirings 2 so as to correspond to the electrode pads 8 on the semiconductor chip 4. Auxiliary conductive wirings 11 are placed outside outermost conductive wirings 10, namely, at positions corresponding to outermost corners of the semiconductor chip 4, and auxiliary bumps 12 are formed thereon. One end portion of each of the auxiliary conductive wirings 11 is terminated at a position in the outer side vicinity of the auxiliary bump 12 in an outward direction of the region for mounting the semiconductor chip 4. The auxiliary conductive wiring 11 is bent at the other end portion positioned inside the auxiliary bump 12 in an inward direction of the region for mounting the semiconductor chip 4, and connected to the end of the adjacent outermost conductive wiring 10. However, each of the auxiliary conductive wirings 11 can be connected to not only the adjacent conductive wiring 10 but a plurality of conductive wirings including any other conductive wirings 2 placed on the same side of the semiconductor chip 4. The auxiliary conductive wirings 11 and the auxiliary bumps 12 are formed in the same manner as ordinary conductive wirings 2 and bumps 3.

In the above-mentioned configuration, when the electrode pads 8 on the semiconductor chip 4 and the bumps 3 on the circuit board are connected to each other, stresses applied to the end portions of the bumps 3 at the outermost conductive wirings 10 are relieved by the adjacent auxiliary bumps 12. As having been proved through experiments, since the outermost conductive wirings 10 are hardly broken at positions inside the auxiliary bumps 12 in the region for mounting the semiconductor chip 4, the conductivity of the conductive wirings can be retained.

Though not shown in the drawing, it is preferable that the auxiliary conductive wiring 11 is designed so as to protrude from the designed position for the bump 3 by an amount greater than a displacement that may occur in the step of forming the auxiliary bump 12. The protrusion of the bump 3 from the designed position can be set not to exceed 300 μM, which has been proved through experiments to be sufficiently effective.

Figure 2:
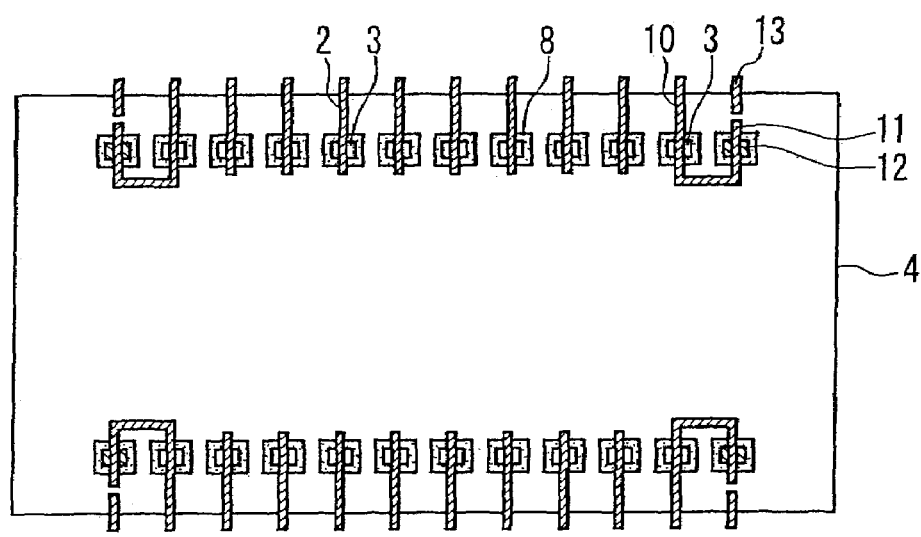
FIG. 2 is a plan view showing a variation at a part of the tape carrier substrate.

FIG. 2 shows a variation of the embodiment as shown in FIG. 1. In this example, dummy conductive wirings 13 are provided as the extensions of the auxiliary conductive wirings 11, outside the auxiliary bumps 12 in the region for mounting the semiconductor chip.

The dummy conductive wirings 13 are not connected to the auxiliary bumps 12 on the auxiliary conductive wirings 11 but they are formed to have the same pattern as the adjacent outermost conductive wirings 10. In the configuration as shown in FIG. 2, since the conductive wiring at each corner of the region for mounting the semiconductor chip 4 has a substantially continuous pattern, the thermal expansion of the circuit board will be even at the time of mounting the semiconductor chip 4 irrespective of the locations. As a result, the local displacement between the bumps 3 and the electrode pads 8 at the time of joining can be avoided. Though not shown in the drawing, the dummy conductive wirings 13 can be connected to the outermost conductive wirings 10 or any other conductive wirings 2 outside the region shown in the drawing.

Second Embodiment

Figure 3:
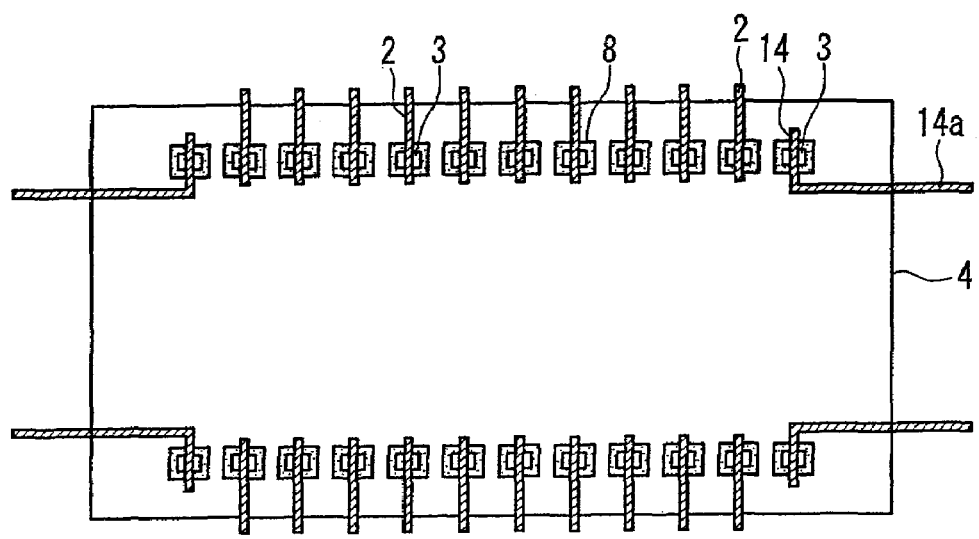
FIG. 3 is a plan view showing a part of a tape carrier substrate in a second embodiment of the present invention.

The configuration of a tape carrier substrate (circuit board) in a second embodiment will be described with reference to FIG. 3. FIG. 3 is a plan view showing a region for mounting a semiconductor chip of a tape carrier substrate in the second embodiment.

In this embodiment, outermost conductive wirings 14 placed at positions corresponding to the outermost corners of the semiconductor chip 4 have structures different from those of the other ordinary conductive wirings 2. Namely, one end portion of each of the outermost conductive wirings 14 is terminated at a position in the outer side vicinity of a bump 3 in an outward direction of the region for mounting the semiconductor chip 4 (upward in the drawing). The outermost conductive wiring 14 is bent at a position inside the bump 3 in an inward direction of the region for mounting the semiconductor chip 4 so as to cross a side edge of the region for mounting the semiconductor chip 4 (right or left in the drawing) adjacent to a side edge where the bump 3 is arranged, and it extends outwards to form a bent wiring portion 14a.

In this configuration, since the outermost conductive wirings 14 are hardly broken at positions inside the bumps 3 on the semiconductor chip 4, the conductivity of the outermost conductive wirings 14 can be retained. Moreover, since stresses applied to the conductive wirings 2 adjacent to the outermost conductive wirings 14 can be relieved due to the contact between the bumps 3 on the outermost conductive wirings 14 and the electrode pad 8, the conductivity of the conductive wirings 2 can be retained.

Though not shown in the drawing, it is preferable that the outermost conductive wiring 14 is designed so as to protrude from the designed position for the bump 3 by an amount greater than a displacement that may occur in the step of forming the bump 3. The protrusion of the bump 3 from the designed position can be set not to exceed 300 μm, which has been proved through experiments to be sufficiently effective.

Furthermore, though not shown in the drawing, similarly to the case as shown in FIG. 2, dummy conductive wirings can be provided as extensions of the outermost conductive wirings 14 outside the bumps 3 in the region for mounting a semiconductor chip. The dummy conductive wiring portions are not connected to the bumps 3 but they are formed to have the same pattern as the adjacent conductive wirings 2. Thereby, the conductive wirings at the corners of the semiconductor chip 4 have the substantially same pattern, and the thermal expansion of the circuit board will be even at the time of mounting the semiconductor chip 4 irrespective of the locations. As a result, locational displacement between the bumps 3 and the electrode pads 8 at the time of joining can be avoided.

Third Embodiment

Figure 4:
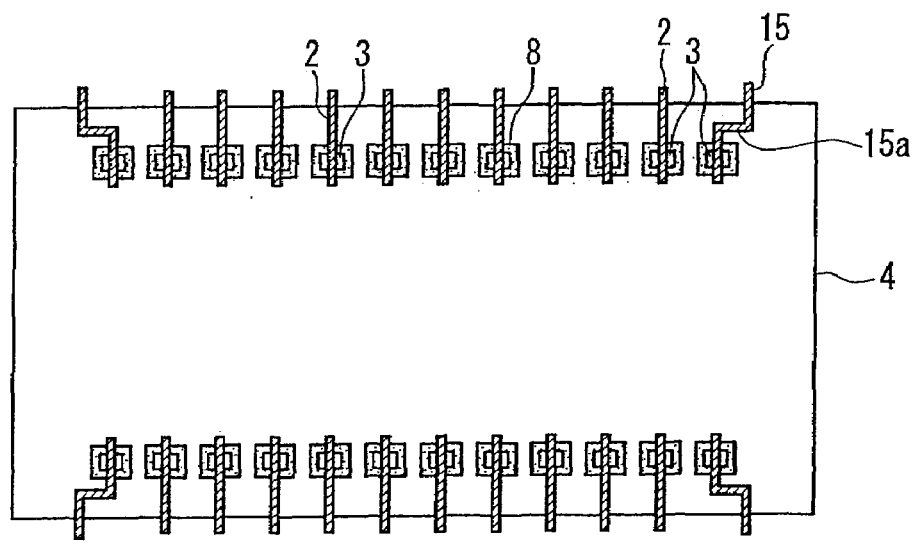
FIG. 4 is a plan view showing a part of a tape carrier substrate in a third embodiment of the present invention.

The configuration of a tape carrier substrate (circuit board) in a third embodiment will be described with reference to FIG. 4. FIG. 4 is a plan view showing a region for mounting a semiconductor chip of a tape carrier substrate in the third embodiment.

In this embodiment, the outermost conductive wirings 15 placed at positions corresponding to the outermost corners of the semiconductor chip 4 have different structures from those of the other ordinary conductive wirings 2. Namely, each of the outermost conductive wirings 15 has at least one bent portion 15a at any position between the bump 3 and the periphery of the region for mounting the semiconductor chip 4. The opposite end portion of the outermost conductive wiring 15 positioned inside the region for mounting the semiconductor chip 4 has the same structure as the ordinary conductive wiring 2.

In this configuration, since the stresses applied to the bumps 3 of the outermost conductive wirings 15 are relieved by the bent portions 15a, the conductivity of the outermost conductive wirings 15 can be retained. Furthermore, since the stresses applied to the conductive wirings 2 adjacent to the outermost conductive wirings 15 are relieved as well due to the contact between the bumps 3 on the outermost conductive wirings 15 and the electrode pads 8, conductivity of the conductive wirings 2 can be retained.

According to the above-mentioned embodiments, breaks in outermost conductive wirings can be suppressed at the time of mounting a semiconductor chip on a circuit board, thereby a reliable semiconductor device can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board comprising:

a flexible insulating substrate, a plurality of conductive wirings formed in line on the flexible insulating substrate, and bumps provided at the end portions of the respective conductive wirings positioned in a region for mounting a semiconductor chip, on which the semiconductor chip can be mounted by bonding electrode terminals formed on the semiconductor chip to the bumps;

the circuit board further comprising:

an auxiliary conductive wiring positioned at an outermost corner of the region for mounting the semiconductor chip, being adjacent to and outside the outermost conductive wiring, and an auxiliary bump formed on the auxiliary conductive wiring in line with the bumps on the conductive wirings, wherein one end portion of the auxiliary conductive wiring is terminated at a position in the outside vicinity of the auxiliary bump in an outward direction of the region for mounting the semiconductor chip, and the auxiliary conductive wiring is bent at the other end portion positioned inside the auxiliary bump in an inward direction of the region for mounting the semiconductor chip, and connected to an end of an adjacent outermost conductive wiring.

2. The circuit board according to claim 1, wherein the auxiliary conductive wiring is terminated at a position outside the auxiliary bump, with a length beyond the auxiliary bump being more than 0 μm and less than 300 μm.

3. The circuit board according to claim 1, wherein a dummy conductive wiring is provided along extension from the end of the auxiliary conductive wiring in an outward direction of the region for mounting the semiconductor chip, the dummy conductive wiring being discontinuous from the auxiliary conductive wiring.

* * * * *